(12) United States Patent
Hassan

(10) Patent No.: US 8,269,538 B2
(45) Date of Patent: Sep. 18, 2012

(54) SIGNAL ALIGNMENT SYSTEM

(75) Inventor: Mahmudul Hassan, San Carlos, CA (US)

(73) Assignee: MoSys, Inc., Santa Clara, CA (US)

( * ) Notice: Subject to any disclaimer, the term of this patent is extended or adjusted under 35 U.S.C. 154(b) by 198 days.

(21) Appl. No.: 12/768,513

(22) Filed: Apr. 27, 2010

(65) Prior Publication Data

US 2010/0271094 A1 Oct. 28, 2010

Related U.S. Application Data

(60) Provisional application No. 61/172,969, filed on Apr. 27, 2009.

(51) Int. Cl.
*H03L 7/00* (2006.01)
(52) U.S. Cl. ......... 327/161; 321/141; 321/145; 375/375
(58) Field of Classification Search .................. 327/141, 327/144–163, 185, 199–203, 208–212, 214, 327/215, 218; 331/1/A, 15–17; 375/373–376
See application file for complete search history.

(56) References Cited

U.S. PATENT DOCUMENTS

| 2007/0194823 A1* | 8/2007 | Kumata ......................... 327/158 |
| 2008/0297216 A1* | 12/2008 | Chiang et al. .................. 327/158 |
| 2009/0096498 A1* | 4/2009 | Huang ........................... 327/158 |

* cited by examiner

*Primary Examiner* — Lincoln Donovan
*Assistant Examiner* — Brandon S Cole
(74) *Attorney, Agent, or Firm* — Bever, Hoffman & Harms LLP; E. Eric Hoffman

(57) ABSTRACT

Through the use of a multi-step sweep, the present invention is capable of increasing the speed and improving the error resistance of a signal alignment. In a specific embodiment of the invention, a method for the signal alignment of a target signal and an adjustable signal is disclosed. The target signal is sampled using three or more phase shifted versions of the adjustable signal to obtain a group of target signal state values. Next, through reference to the group of target signal state values it is determined that an edge of the target signal lies between a first phase shifted version and a second consecutive phase shifted version. In response, the first phase shifted version is selected as the starting point for a second sweep. During the second sweep, the phase of the first phase shifted version is sequentially adjusted in relatively small incremental steps to minimize the phase difference relative to the target signal.

21 Claims, 12 Drawing Sheets

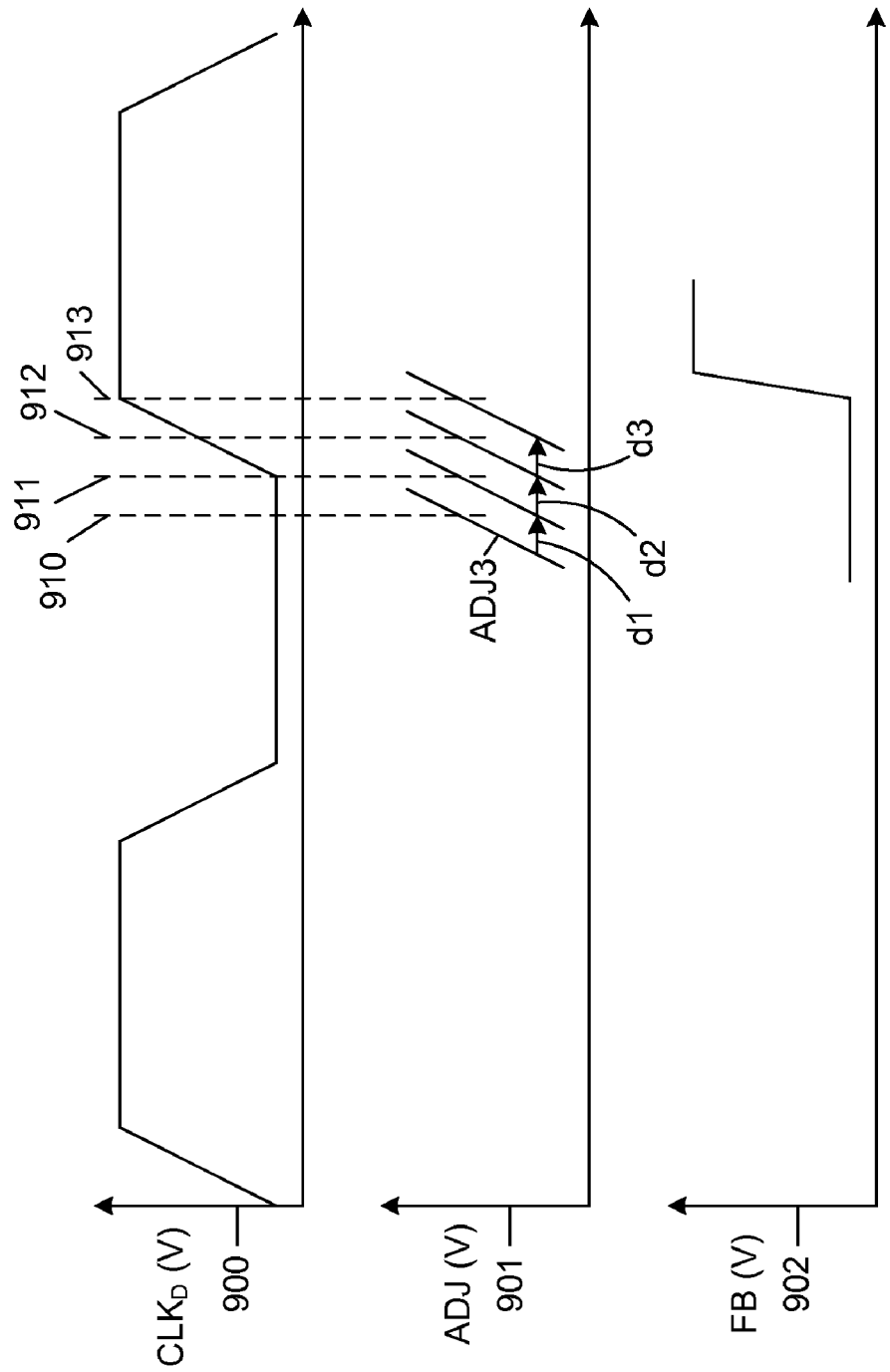

US 8,269,538 B2

SIGNAL ALIGNMENT SYSTEM

CROSS-REFERENCES TO RELATED APPLICATION

This application claims the benefit of U.S. Provisional Patent Application No. 61/172,969, titled "A FAST EFFICIENT APPROACH TO DDR3 WRITE LEVELING," by Hassan, filed Apr. 27, 2009, which is incorporated herein by reference for all purposes.

FIELD OF THE INVENTION

The invention relates generally to signal alignment systems and more specifically to aligning periodic signals in an electronic circuit.

BACKGROUND OF THE INVENTION

There is a constant impetus in the electronics sector to provide electronic devices with more functionality at greater speed. Greater functionality generally requires increased complexity in the form of an increased number of signals and subsystems. For an electronic system to operate, all of these myriad subsystems must be functioning in synchronicity to accomplish the system's overall objectives. The required accuracy of this synchronization increases proportionally with the speed of operation, and current consumer-available computer processing units operate using clocks that have cycle times as small as 0.3 nanoseconds. Finding methods and circuits for aligning the multitude of electronic signals flowing between ever growing numbers of electronic subsystems with increasing accuracy is a formidable challenge for the electronics industry.

In modern electronic systems, the clock signal is generally the fastest and most widely distributed signal in the system. Full distribution of the clock is necessary because it provides information about what the entire system is doing so that each subsystem can execute their assigned task at the right time. Therefore, the arrival of the clock at each subsystem must be carefully synchronized because skews between the clocks arrival will limit the maximum operational speed of the system, and may cause race conditions where one subsystem is no longer acting in tandem with the rest of the system.

A simple electronic clock signal will consist of a periodic signal transitioning between low and high states on a clock edge twice every clock period. Circuits can be triggered to execute tasks on the rising or falling edges of the clock, and double data-rate (DDR) circuits can execute tasks on both of these edges. Regardless of which portion of the clock is used to trigger actions by the circuit, it is important that the trigger portion of the clock signal be delivered in such a way that all subsystems receive it simultaneously.

The problem of routing a clock signal through a circuit such that all subsystems are acting in synchronization can be solved through the use of special physical layout approaches such as a t-branch topology. In a t-branch topology, each branch of the clock is split into two sub-branches until there are as many sub-branches as subsystems requiring a clock signal. The physical layout is done such that every signal needs to travel through the same number of branch splits and hence the same overall distance. Thereby, the clock signal reaches every subsystem at the same time. The problem with this type of approach is that each t-branch degrades the integrity of the clock signal and creates a corresponding increase in clock skew. This problem can only be remedied through the use of expensive termination circuits.

The problem of multiple terminations and the resultant degradation of the clock signal is well known in the art and is often alleviated through the use of fly-by topology. Fly-by topology is a layout pattern that relies on sending signals that are required by multiple subsystems on a single path. Since this topology allows for higher signal integrity without the use of expensive termination circuits, it is the preferred topology in high speed applications. For example, when the Joint Electron Device Engineering Council (JEDEC) released its double data rate three (DDR3) memory system specification as an improvement over double data rate two (DDR2), the method for sending the system clock from the controller to the memory modules was changed from a branching to a fly-by approach. This is because DDR3 is meant for higher frequency operation, and fly-by preserves signal integrity at the level required for high frequency operation.

Although the fly-by topology approach eliminates problems caused by signal line branching, another problem is created. In FIG. 1, control circuit 100 sends a first signal required by both subsystems 101 and 102 along fly-by configured line 103. Control circuit 100 also sends signals individually to subsystems 101 and 102 along directly connected lines 111 and 112. The problem at issue is caused by the fact that the distance from control circuit 100 to subsystem 101 along line 103 is much shorter that the distance from control circuit 100 to subsystem 102 along line 103, whereas the length of data line 111 and 112 are nearly the same. Therefore, a problem arises because if the signals sent along lines 111, 112, and 103 are aligned at the control circuit 100, the arrival of the fly-by configured signal and the direct coupled signals at operative areas 121 and 122 will not be synchronized.

In the specific context of a DDR3 memory system, the fly-by topology problem manifests itself through the relationship of the system clock and the DDR3 data strobe signals (DQS). During a write operation, individual bytes in a DDR3 memory module need to receive a DQS signal aligned with the data it is receiving on its data bus. In addition, each memory module needs to receive a clock signal that is synchronized with the command/address bus through a fly-by topology. If the clock and DQS signals are not aligned, data could be written to the wrong address. In a DDR3 system, the memory controller would be control circuit 100, an individual byte on the DDR3 memory module could be represented by subsystem 101, the clock signal line could be represented by line 103, and the DQS signal line for byte 101 could be represented by line 111. In order to assure a race condition does not occur where desired data is written to the wrong address, the clock and each individual DQS signal must be aligned at the memory module boundary which is represented in FIG. 1 by operative areas 121 and 122.

The process of aligning the DQS and system clock signals is called write leveling. The industry standard approach to write leveling in DDR3 is described in JEDEC's JESD79 specification. Under the JEDEC approach, the clock is aligned with the data strobe signal by adding a certain amount of delay to each of the individual data strobe signals before they are sent out by the memory controller. These delays are individually calibrated so that the data signals arrive at the operative point of each subsystem at the same time as the clock. The JEDEC write leveling approach can be best described with reference to FIG. 2 and FIG. 3.

FIG. 2 shows a single subsystem 210 and the accompanying portion of the control circuit 200 for calibrating an individual signal with the clock in a manner consistent with the JEDEC approach. In FIG. 2, subsystem control circuit 200 takes in the target signal on node 201, and contains variable delay element 202. The subsystem control circuit 200 is connected to subsystem 210 by three interconnects 220, 221, and 222. The relative lengths of interconnects 220 and 221 are representative of the increased distance associated with the signal paths, and the commensurate increase in time it takes for a signal to propagate through interconnect 220 as compared to interconnect 221. Subsystem edge 212 sufficiently defines the operative node of subsystem 210 because signal propagation times within the subsystem are negligible. Sampling flop 211 samples the target signal on node $V_{TR}$ while being clocked by the delayed target signal on node $V_{DTR}$, and outputs a value on node $V_{FB}$. Sampling flop 211 has the basic characteristics of a simple DQ flop such that on the rising edge of a pulse sent to its clock input, it will output the value on its input node $V_{TR}$ on its output node $V_{FB}$. Variable delay element 202 applies a delay to the signal received from node 201 to produce a delayed signal on node $V_{DOUT}$.

FIG. 3 displays a timing diagram that illustrates the calibration algorithm applied to the system in FIG. 2 using the JEDEC approach. The voltage signal on node $V_{DTR}$ is shown on axis 301, the voltage signal on node $V_{TR}$ is shown on axis 302, and the voltage on node $V_{FB}$ is shown on axis 303. The x-axis of all three axes is in units of time and they are all aligned with y-intercepts of time equal to zero. The double hash marks on each of the x-axes indicate a break in the uniform scale of the time value. The hash marks obscure a full system period, wherein another signal is prepared and output by variable delay element 202. The system period hash marks also divide the figure into three portions. Portions 304, 305, and 306 each display the voltages as they behave in a first, second, and third consecutive system periods respectively.

Before any delay is added by variable delay element 202, the target signal 201 (e.g., a system clock signal) will pass through the delay element 202 unhindered and arrive at node $V_{DTR}$ before the target signal (system clock signal) arrives at node $V_{TR}$. This is shown through comparison of the first rising edge on axes 301 and 302 respectively in portion 304. These first pulses are not aligned in the sense that they have a non-zero phase difference. Having a non-zero phase difference means that although they have the same period and pulse characteristic, their re-initializations do not occur at the same point in time. Since the signal sampled on node $V_{TR}$ has not yet been re-initialized, when the rising edge of the pulse on node $V_{DTR}$ triggers a sampling of the voltage on node $V_{TR}$, a low value is sampled. Therefore, the voltage on node $V_{FB}$ on axis 303 remains low.

In the next phase of the JEDEC approach, variable delay element 202 will begin to incrementally increase the delay applied to the target signal received from node 201. Portion 305 shows the changes to the relevant signals after the delay element has been incremented. A single step of this process can be seen with reference to the pulses in portion 305 on axis 301. The second of these two pulses is the target signal arriving at node $V_{DTR}$ after the variable delay produced by variable delay element 202 has been incremented one step. The first pulse is shown using a dotted line and is not actually present in the system at that time. The pulse is represented only to show when the delayed target signal would have arrived if no change to the delay element had been made. The difference between the two pulses measured in time is marked on axis 301 with the indication $t_{step}$. Although the rising edges of the solid line pulse of axis 301 and the pulse of axis 302 are closer in portion 305 than they are in portion 304, the voltage on node $V_{TR}$ is still low on the rising edge of the pulse at node $V_{DTR}$ so the voltage on node $V_{FB}$ on axis 303 remains low.

The waveforms in portion 306 of FIG. 3 illustrate the system reaching a lock condition. In portion 306, the pulse arriving at node $V_{DTR}$ has been delayed by the variable delay element 202 by a phase distance of two delay steps. The dotted line pulses in portion 306 on axis 301 are displayed purely to show when the signal would have arrived if delay element 202 had applied either one step delay, or zero delay. In portion 306 of the axes, the signal on node $V_{DTR}$ (axis 301) is high when a rising edge of a pulse is received at node $V_{TR}$ as shown on axis 302 by reference line 307. As such, the sampling flop will output a signal that transitions from low to high on node $V_{FB}$ which is illustrated in portion 306 on axis 303. Once the pulse signal on node $V_{FB}$ (axis 303) is received by delay element 202, the control circuit 200 will fix the delay applied and the calibration according to the JEDEC approach will be complete.

There is a great need for signal alignment systems in complex high speed electronic systems. When circumstances require that the signals cannot be sent along paths of equal length, the possibility that the signals will be skewed upon arrival at their operative points increases dramatically. The approach taken by JEDEC to ameliorate this problem in the DDR3 specification is to add a delay to the faster signal at the point the signals take divergent paths.

SUMMARY OF INVENTION

In one aspect of the invention, a method for reducing a phase difference between a target signal and an adjustable signal is provided. The target signal is initially sampled using a group of three or more phase shifted versions of the adjustable signal to obtain a group of target signal state values. The group of target signal state values is then evaluated to determine which one of the three or more phase shifted versions of the adjustable signal leads the target signal by a smallest phase difference. This phase shifted version of the adjustable signal is identified as the 'selected' phase shifted version of the adjustable signal. A second sampling sweep is then performed, starting with the selected phase shifted version of the adjustable signal (which is relatively close to the rising edge of the target signal). During the second sampling sweep, the selected phase shifted version of the adjustable signal is incrementally delayed (in relatively small steps) until the adjustable signal is aligned with the target signal.

Each of the three or more phase shifted versions of the adjustable signal are separated by relatively large phases. For example, there may be four phase shifted versions, which are each separated by a 90 degree phase delay. The phase differences between the phase shifted versions of the adjustable signal are selected to be large enough to ensure that consecutive samples to not experience sampling errors (which could otherwise exist due to, for example, the aperture window of the sampling device, jitter in the target signal or delay error in the adjustable signal).

Because the second sampling sweep is guaranteed to start at a location relatively near to the rising edge of the target signal, the incremental delays introduced during this sweep are not required to be monotonic. This allows these incremental delays to be generated with relatively inexpensive circuitry, such as an open-loop string of delay buffers having a plurality of associated taps.

In another aspect of the invention a method for reducing a phase difference between a data strobe signal and a clock signal in a memory system is provided. In a first step, a clock signal is sampled at a memory cell boundary using a group of three or more phase shifted versions of the data strobe signal to obtain a group of associated clock state values. The group of three or more phase shifted versions includes consecutive first and second phase shifted versions. In the next step, the first phase shifted version is selected, because the first phase shifted version and the second phase shifted version have first and second associated clock state values from the group of associated clock state values that are low and high respectively. Next, the phase of the data strobe signal is set substantially equal to the phase of the first phase shifted version. Finally, the phase of the data strobe signal is adjusted until the phase difference between the clock signal and the data strobe signal is minimized.

BRIEF DESCRIPTION OF THE DRAWINGS

FIGS. 9A and 9B are waveform diagrams illustrating various voltages in FIG. 8, when implementing the method of FIG. 7, in accordance with one embodiment of the present invention.

DETAILED DESCRIPTION OF THE PREFERRED EMBODIMENTS

Reference now will be made in detail to embodiments of the disclosed invention, one or more examples of which are illustrated in the accompanying drawings. Each example is provided by way of explanation of the present technology, not as a limitation of the present technology. In fact, it will be apparent to those skilled in the art that modifications and variations can be made in the present technology without departing from the spirit and scope thereof. For instance, features illustrated or described as part of one embodiment may be used on another embodiment to yield a still further embodiment. Thus, it is intended that the present subject matter covers such modifications and variations as come within the scope of the appended claims and their equivalents.

The current approach to signal alignment adopted by JEDEC for DDR3 has two major drawbacks. Firstly, because of the way the alignment algorithm operates, up to 10 milliseconds may pass before the signals are locked and properly aligned. Secondly, the JEDEC approach has the potential to create a false lock where the signals are not actually aligned. Depending upon how badly the error manifests itself, this can lead to catastrophic system failure. The risk of false lock can be mitigated through the use of additional circuitry to double check the accuracy of the lock, or through the use of highly accurate clock signals and delay elements. However, additional circuitry and circuits with greater accuracy are generally more costly. Through the use of a multi-step sweep of the target signal, the present invention is capable of addressing these drawbacks. The present invention is capable of outperforming the speed of existing techniques, reduces false locking such that additional circuitry is not required to check the alignment accuracy, and loosens the accuracy requirements of the delay and clock elements for a resultant savings in design effort and circuit area consumption.

Figure 1:
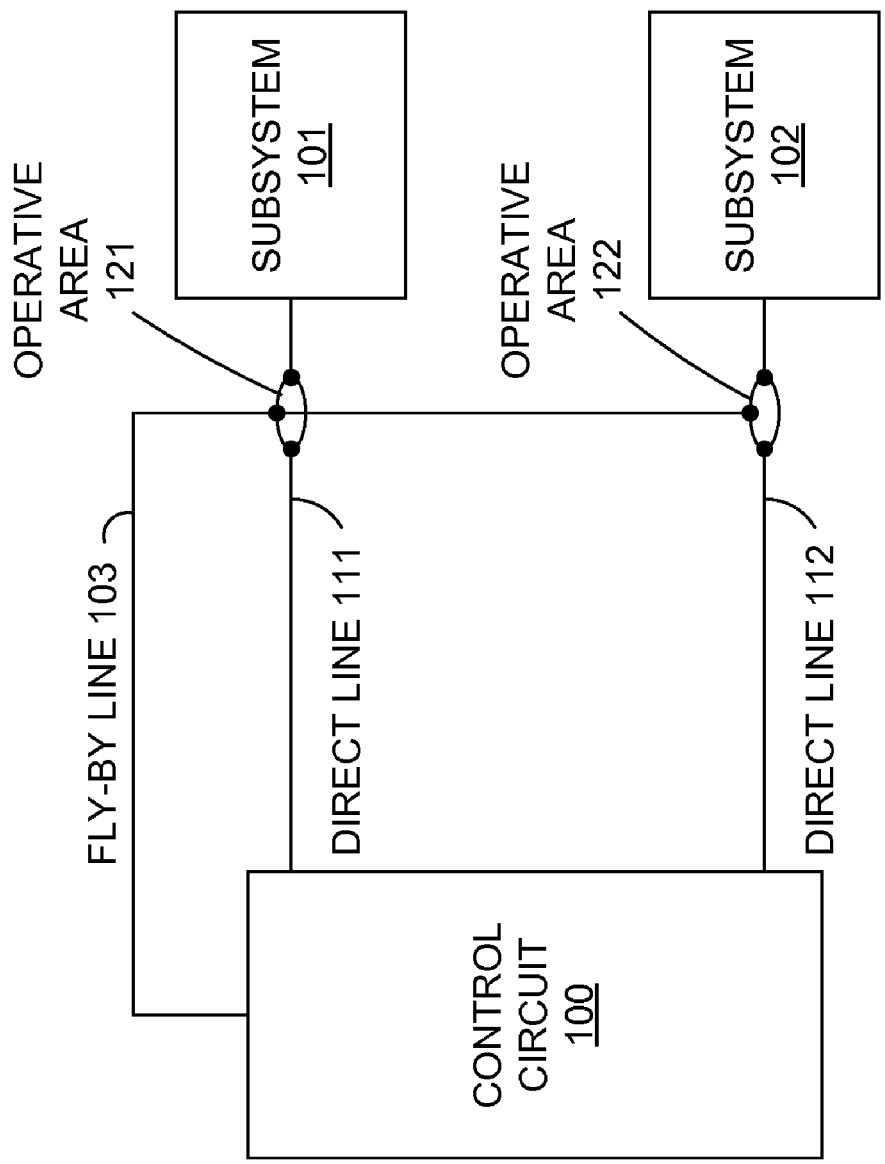
FIG. 1 is a block diagram of a conventional system that includes a control circuit and two subsystems that are clocked using a fly-by topology.
Figure 2:
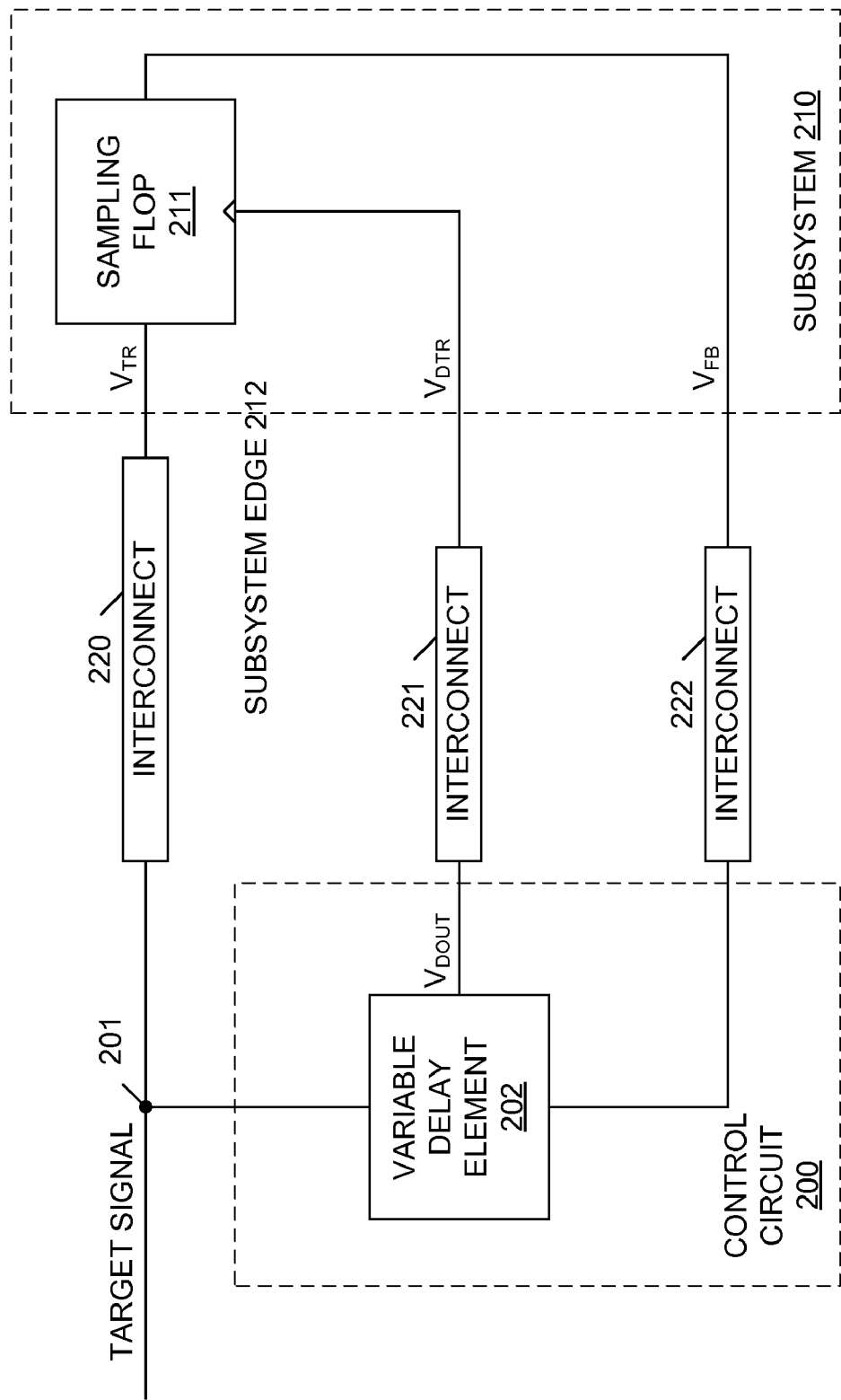
FIG. 2 is a block diagram of a conventional system that aligns signals received at a subsystem in accordance with a JEDEC standard.
Figure 3:
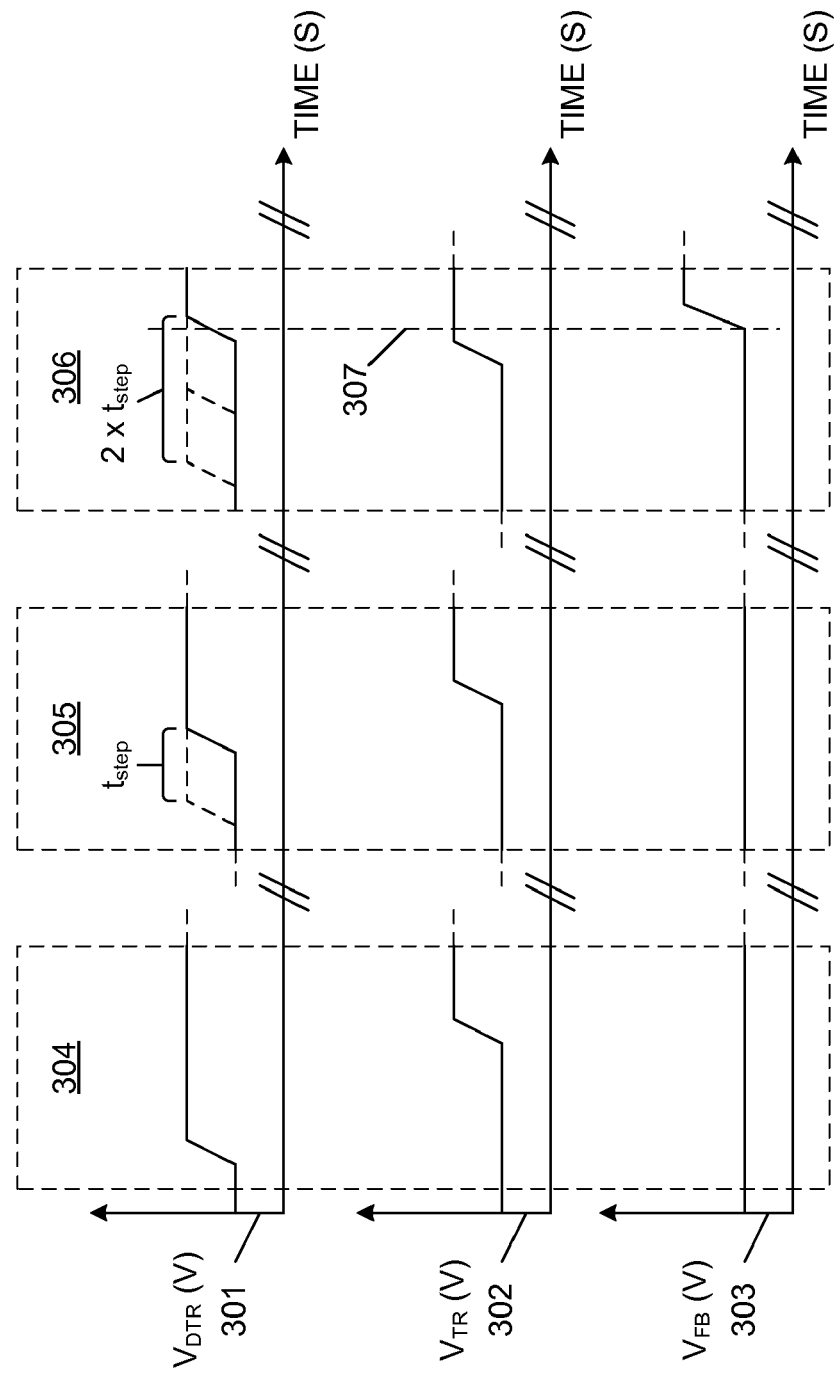
FIG. 3 is a waveform diagram illustrating the timing of signals present in the conventional system of FIG. 2.
Figure 4:
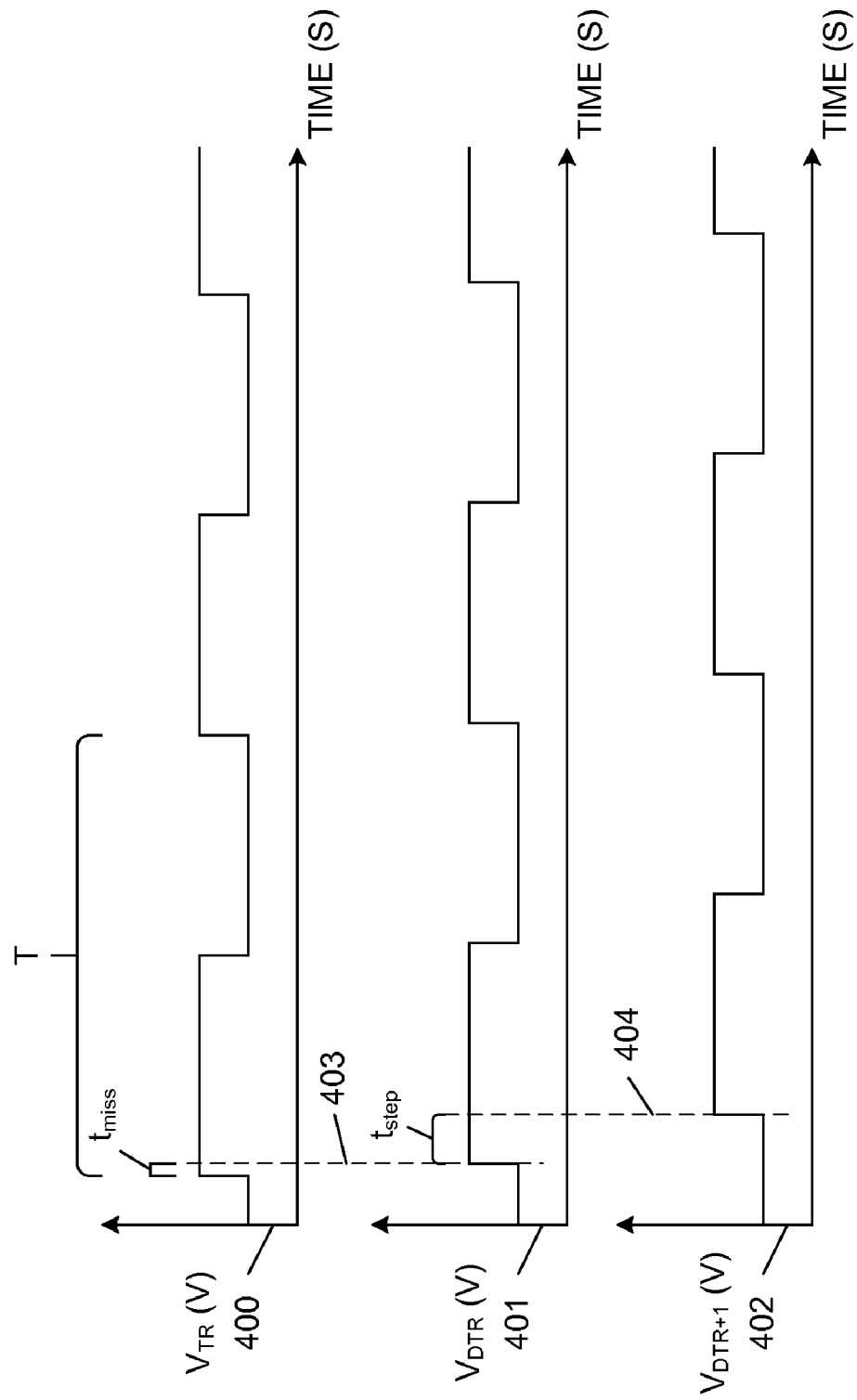
FIG. 4 is a waveform diagram illustrating the timing of signals present in the conventional system of FIG. 2.

The potential for slow locking times using the traditional approach can be described with reference to FIG. 2 and FIG. 4. Axis 400 shows the voltage at node $V_{TR}$ in FIG. 2. Axes 401 and 402 both show the voltage at node $V_{DTR}$ in FIG. 2. The units of the x-axis of axes 400, 401, and 402 are all time. The y-intercepts of axes 400 and 401 are aligned. However, the y-intercept of axis 402 is shifted ahead of those on axes 400 and 401 by one time step. Therefore, superimposing a signal from axis 402 onto axis 400 would provide graphical information regarding the relative phase difference of the signals on these axes. Reference lines 403 and 404 are drawn to show the relative phase difference between the rising edges of the signals on the two possible consecutive pairs of axes.

Assuming that the pulse displayed on axis 401 was used to create the first sample taken of the voltage on node $V_{TR}$, the time value $t_{miss}$ shows how close the system was to sampling a low value. Based on this sample, the voltage on feedback output node $V_{FB}$ will remain high and the algorithm will continue its search for a low to high transition on $V_{FB}$. In order for sampling flop 211 to be set low, and then back to high, the delayed signal will need to be swept through the entire extent of the clock's period T. The marked distance $t_{step}$ shows how far the delay element will sweep the delay signal in each step. Assuming that $t_{miss}$ is of negligible size, the total number of steps that the voltage on node $V_{DTR}$ will need to be swept through is the length of the period T divided by $t_{step}$.

The total time for lock is not just set by the number of steps that will have to occur, but also by the time it takes the system to take each step. In the DDR3 specification, the DQS signal that is sent along interconnect 221 cannot be sent every clock period. In order for communication between the controller and the memory modules to function under the specification, there are a minimum number of clock pulses that must pass between transmissions of the DQS signal. This minimum number of clock pulses is referred to using the variable N. Therefore, the time it will take to make the requisite number of steps is:

$$N \times T^2 / t_{step}$$

In the case of a DDR3-1333 memory system the period T is 1.5 nanoseconds and the limit on successive pulse spacing is 7.5 nanoseconds, which therefore sets N to six. With a step size $t_{step}$ of 15 picoseconds, the total lock time would be 0.9 microseconds. However, since the prior art is susceptible to false lock, several samples need to be taken at each delay increment. This number of samples is often referred to using the variable k. For a system where k was set to three, the lock time would be 2.7 microseconds.

Figure 5:
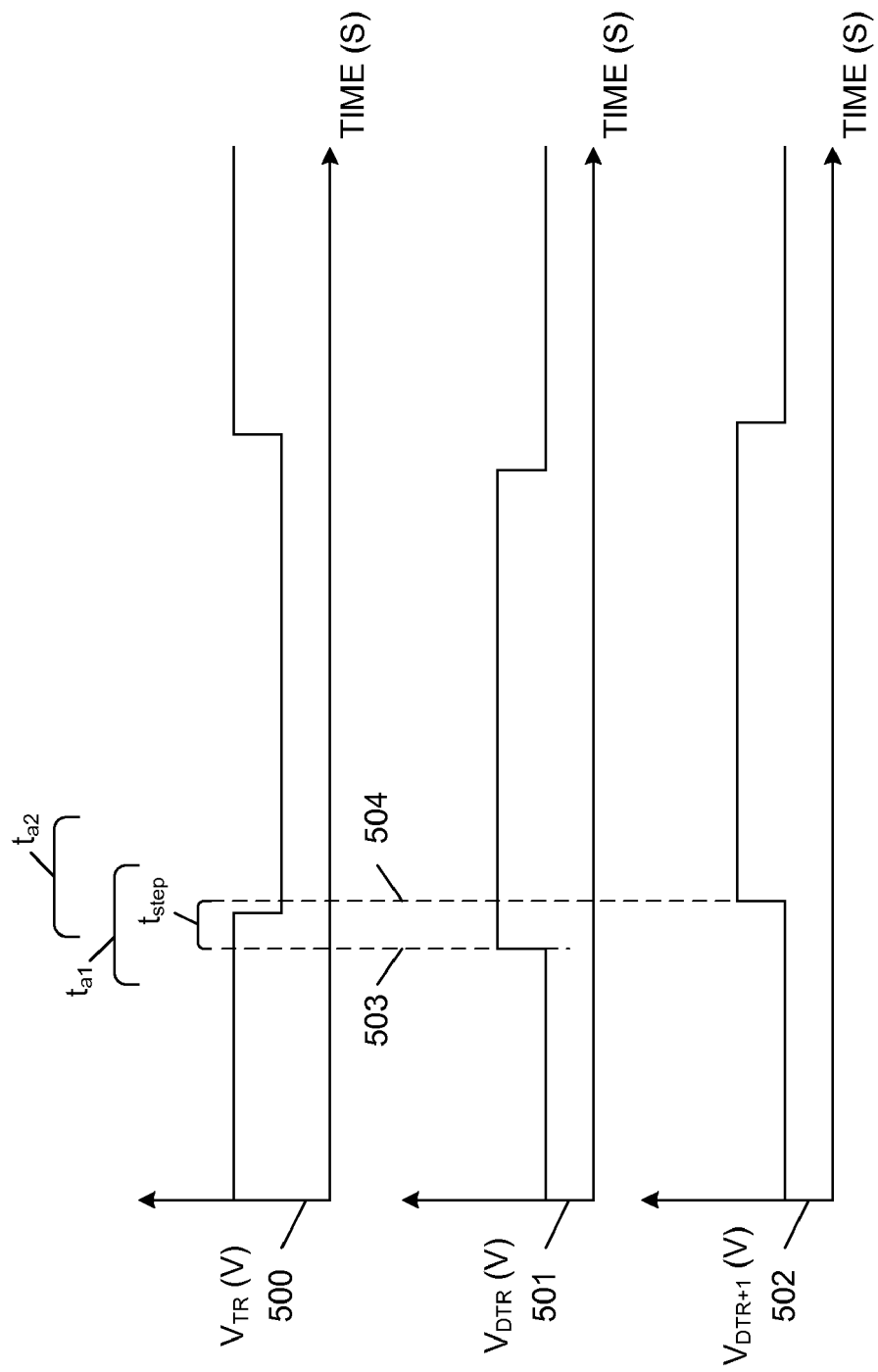
FIG. 5 is a waveform diagram illustrating one instance of false sampling exhibited by the conventional system of FIG. 2.
Figure 6:
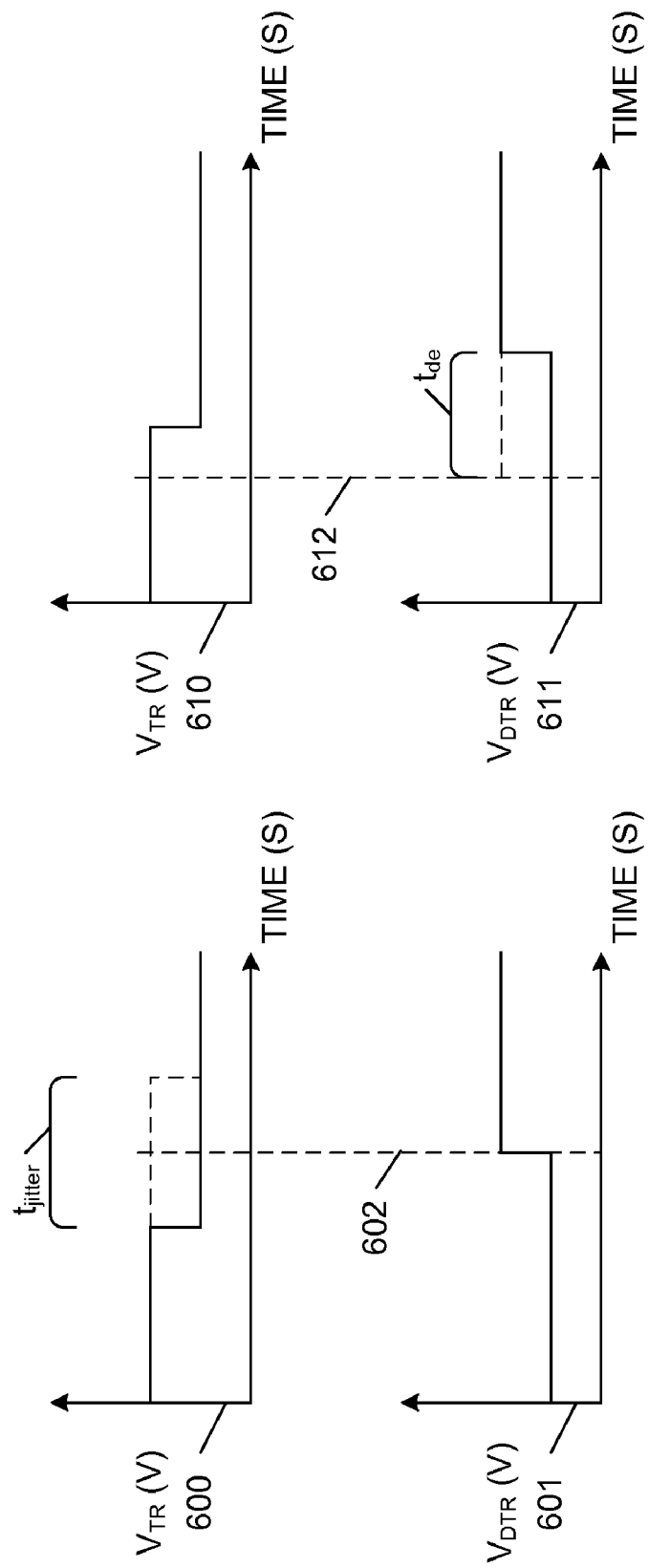
FIG. 6 is a waveform diagram illustrating another instance of false sampling exhibited by the conventional system of FIG. 2.

The possibility of false lock using the traditional approach for write leveling can be described with reference to FIG. 5 and FIG. 6. FIG. 5 illustrates the possibility of false lock from a small delay increment, and FIG. 6 illustrates the possibility of false lock from clock jitter, or non-monotonic behavior of the delay placed on the DQS signal. In the case of a two phase low-high target signal, false lock is caused with the erroneous detection of a low-high transition. As discussed below, false detections generally occur in the vicinity of the falling edge of such a target signal, and can be mitigated by having a large step size for the phase delay increment.

Axis 500 in FIG. 5 shows a single period of the system clock at the sampling location (i.e., at node $V_{TR}$). Axis 501 shows a first sampling DQS pulse at the sampling location (i.e., node $V_{DTR}$) and axis 502 shows the same signal shifted ahead by a time step. Reference line 503 is drawn to show the point at which the voltage on node $V_{DTR}$ triggers a sampling of the clock voltage on node $V_{TR}$. For the flop 211 to correctly sample a signal, the signal must remain stable for a period known as the aperture window of the flop $t_a$. If a flop samples a signal that transitions during the aperture window, the flop may sample the input incorrectly. In this case, it is possible that the sampling performed in response to the voltage on node $V_{DTR}$ as shown on axis 501 will produce a false low value for the signal sampled on node $V_{TR}$ (axis 500), because the clock signal transitions within the aperture window $t_{a1}$. Also, if the delay increment $t_{step}$, is smaller than the aperture window of the flop 211 it is possible that the next sampled value will also be incorrect. For example, in FIG. 5 the signal on axis 502 is the next incremented version of the signal on node $V_{DTR}$ signal used to sample the clock signal on node $V_{TR}$. This pulse will sample the clock signal at the point marked by reference line 504. Again, because the clock signal is transitioning within the aperture window $t_{a2}$ another false sampling may occur. If this second sample registers a high value, then the system will have detected a transition from low to high triggered erroneously by a falling edge of the clock signal. However, if $t_{step}$ had been larger than the aperture window of the sampling device 211, then it would not have been possible to have two consecutive erroneous detections.

False lock can also occur with typical detection circuits due to clock jitter and non-monotonic behavior of the delay element 202. In the case of a two phase high-low target signal, clock jitter and non-monotonic behavior of the delay element 202 can each cause the detection of a false low or false high value. A false high detection following a low detection will cause false lock as well as a false high following a false low. These conditions are illustrated in the waveform diagram of FIG. 6. Axis 600 shows the clock signal on node $V_{TR}$ as it should appear as a solid line, and the clock signal as it may appear on node $V_{TR}$ due to clock jitter as a dotted line. Axis 601 shows the signal on node $V_{DTR}$ used to sample the clock signal, and is aligned in time with axis 600.

As seen with regards to reference line 602, the sampling of an error free clock signal would have resulted in a low value, but because of clock jitter of time length $t_{jitter}$ the sampled value will be high. Axis 610 and 611 show how the same result can occur because of a non-monotonic delay element 202. Axis 610 shows an error free clock that is to be sampled at node $V_{TR}$. Axis 611 shows the expected delay as a solid line and the resulting delayed signal owing to non-monotonic delay as a dashed line. Axis 610 and 611 are also aligned as to time. The desired and actual sampling points are separated by a delay error $t_{de}$. As can be seen upon examination of reference line 612, the non-monotonic delay of the delay element will cause an erroneous high value to be sampled. Both of the exemplified error modes result in a false high detection. For either of these modes to trigger a false lock, they must have been preceded by a false low detection. However, for either of these error modes to cause two consecutive false detections, the two samples must be within a time distance of $t_{jitter}$ or $t_{de}$.

Therefore, if the step distance between two consecutive sampling values is greater than $t_{jitter}$ or $t_{de}$, neither error mode will be capable of triggering a false lock.

Embodiments of the present invention overcome the slow locking time of the prior approach, and do so in a much more error resistant manner. The operation of an example embodiment of the invention can be described with reference to FIG. 7. The flow chart in FIG. 7 outlines a method for reducing the phase difference between a target signal and an adjustable signal that is consistent with the present invention. Step 701 describes sampling a target signal using phase shifted versions of an adjustable signal. This sampling produces a set of target signal state values that create a signature of the target signal. In accordance with one embodiment, the phase shifted versions of the adjustable signal sample the target signal in at least three locations of a period of the target signal. In addition, the successive phase shifted versions of the adjustable signal exhibit a step size $t_{step}$ that is larger than the aperture window of the sampling flop, larger than the maximum clock jitter duration $t_{jitter}$, and larger than the maximum adjustable delay error duration $t_{de}$, thereby avoiding the false sampling conditions described above in connection with FIGS. 5 and 6.

In general, there are M versions of the adjustable sample signal, which are phase shifted by 360°/M with respect to one another (wherein M is greater than or equal to 3). In a particular embodiment, there are four versions of the adjustable sample signal, which are phase shifted by 90 degrees with reference to the period of the target signal. Thus, a first phase shifted version of the adjustable sample signal may be unshifted (0 degrees), a second phase shifted version of the adjustable sample signal may be shifted by one quarter cycle of the target signal (90 degrees), a third phase shifted version of the adjustable sample signal may be shifted by one half cycle of the target signal (180 degrees) and a fourth phase shifted version of the adjustable sample signal may be shifted by ¾ cycle of the target signal (270 degrees).

In step 702, the obtained target signal state values are evaluated to identify which one of the phase shifted versions of the adjustable signal has a rising edge that leads a rising edge (or reinitialization) of the target signal by the smallest phase difference. That is, which of the phase shifted versions of the adjustable signal samples a target signal having a value of '0', and is followed by a consecutive phase shifted version of the adjustable signal that samples a target signal having a value of '1'. The phase shifted version of the adjustable signal identified by the above-described evaluation is selected for further use in the process, as described in more detail below. This signal is hereinafter referred to as the selected phase shifted version of the adjustable signal.

In step 703, the adjustable signal is set equal to the phase shifted version of the adjustable signal identified in step 702. Finally, in step 704 the selected phase shifted version of the adjustable signal is adjusted until this signal is aligned with the target signal. More specifically, relatively small delays (e.g., delays of about 15 ps) are sequentially introduced to the selected phase shifted version of the adjustable signal until the resulting signal is aligned with the target signal. In one embodiment, the relatively small delays introduced during step 704 are selected to be on the order of about 1/16 to 1/100 of the period of the target signal.

Figure 7:
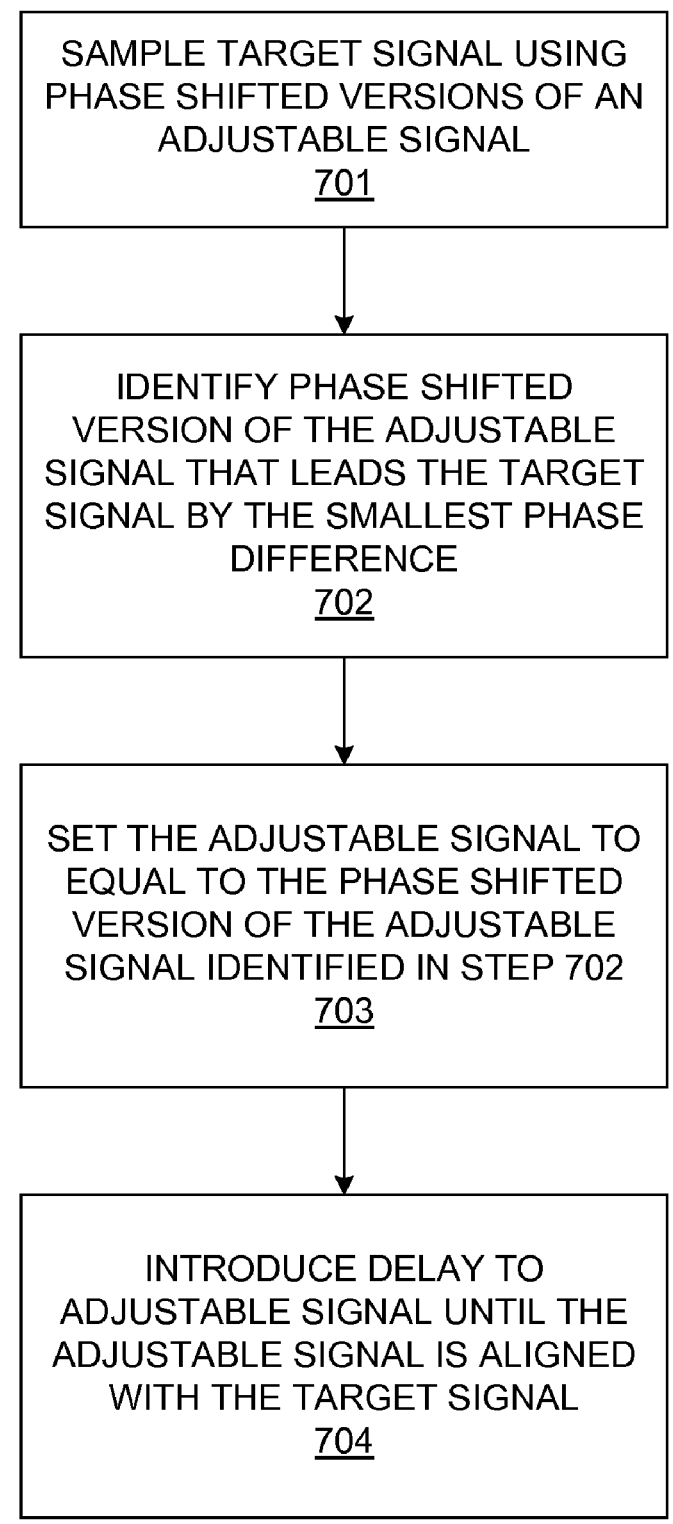
FIG. 7 is a flow diagram illustrating a method for aligning an adjustable signal with a target signal in accordance with one embodiment of the present invention.
Figure 8:
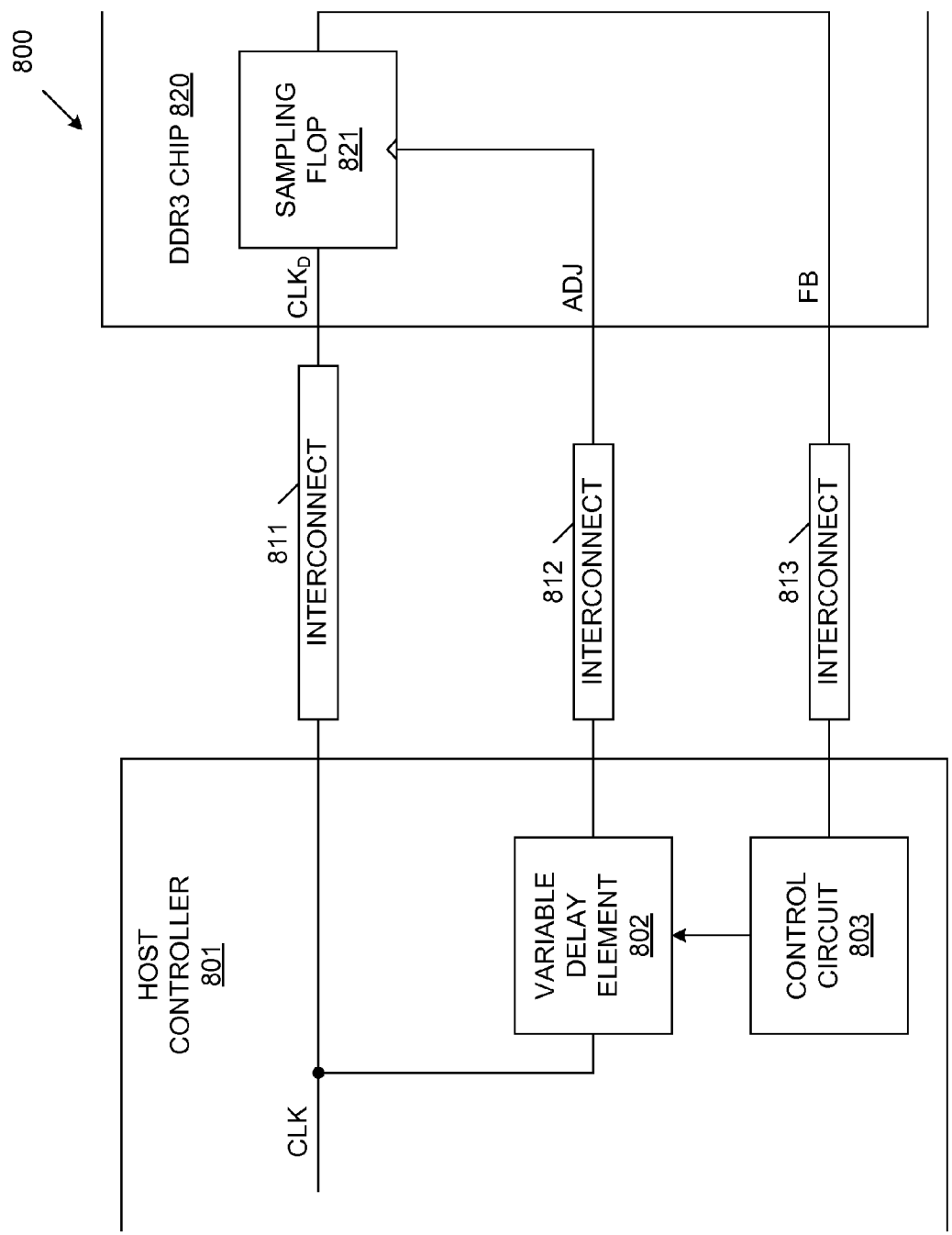
FIG. 8 is a block diagram illustrating a system that implements the alignment method of FIG. 7 in accordance with one embodiment of the present invention.

In a particular embodiment, the method illustrated by FIG. 7 can be applied to achieve write leveling in a DDR3 system. FIG. 8 is a block diagram of a DDR3 system 800, which includes host controller 801, interconnect structures 811-813 and DDR3 chip 820. Host controller 801 includes variable delay element 802 and control circuit 803. DDR3 chip 820 includes a sampling flop 821 in accordance with the JEDEC specification. Host controller 801 provides the system clock CLK to an input of the sampling flop 821 through interconnect 811. The data input of sampling flop 821 therefore receives a delayed version of the system clock, which is labeled as the delayed clock signal $CLK_D$. This delayed clock signal $CLK_D$ is the target signal in the described example. Note that the system clock CLK and delayed clock signal $CLK_D$ may both be differential signals in one embodiment. Variable delay element 802 introduces delays to the system clock signal to generate an adjustable signal, which is provided to interconnect 812. The clock terminal of sampling flop 821 therefore receives a delayed version of the system clock, which is labeled as the adjustable signal ADJ. Sampling flop 821 provides a feedback signal FB to control circuit 803 through interconnect 813.

The relative lengths of interconnects 811 and 812 are representative of the increased distance associated with the signal paths, and the commensurate increase in time it takes for a signal to propagate through interconnect 811 as compared to interconnect 812. Interconnects 812 and 813 have matched delays, which correspond to the delays introduced by an individual data strobe signal transmitted from host controller 801 to DDR3 chip 820 during normal operation of system 800. Thus, the adjustable signal ADJ represents a data strobe signal received by DDR3 chip 820.

Control circuit 803 operates in the manner described above in connection with FIG. 7 to create phase shifted versions of the adjustable signal ADJ. The adjustable signal ADJ causes sampling flop 821 to sample the delayed clock signal $CLK_D$ at the operative location. The operative location in this case would be the boundary of DDR3 chip 820. As described in more detail below, the selected phase shifted versions of the adjustable signal ADJ will be the versions that sample the delayed clock signal $CLK_D$. The final adjustment could then be done using a linear sweep similar to the JEDEC approach, or some other more complex form of adjustment.

Figure 9A:
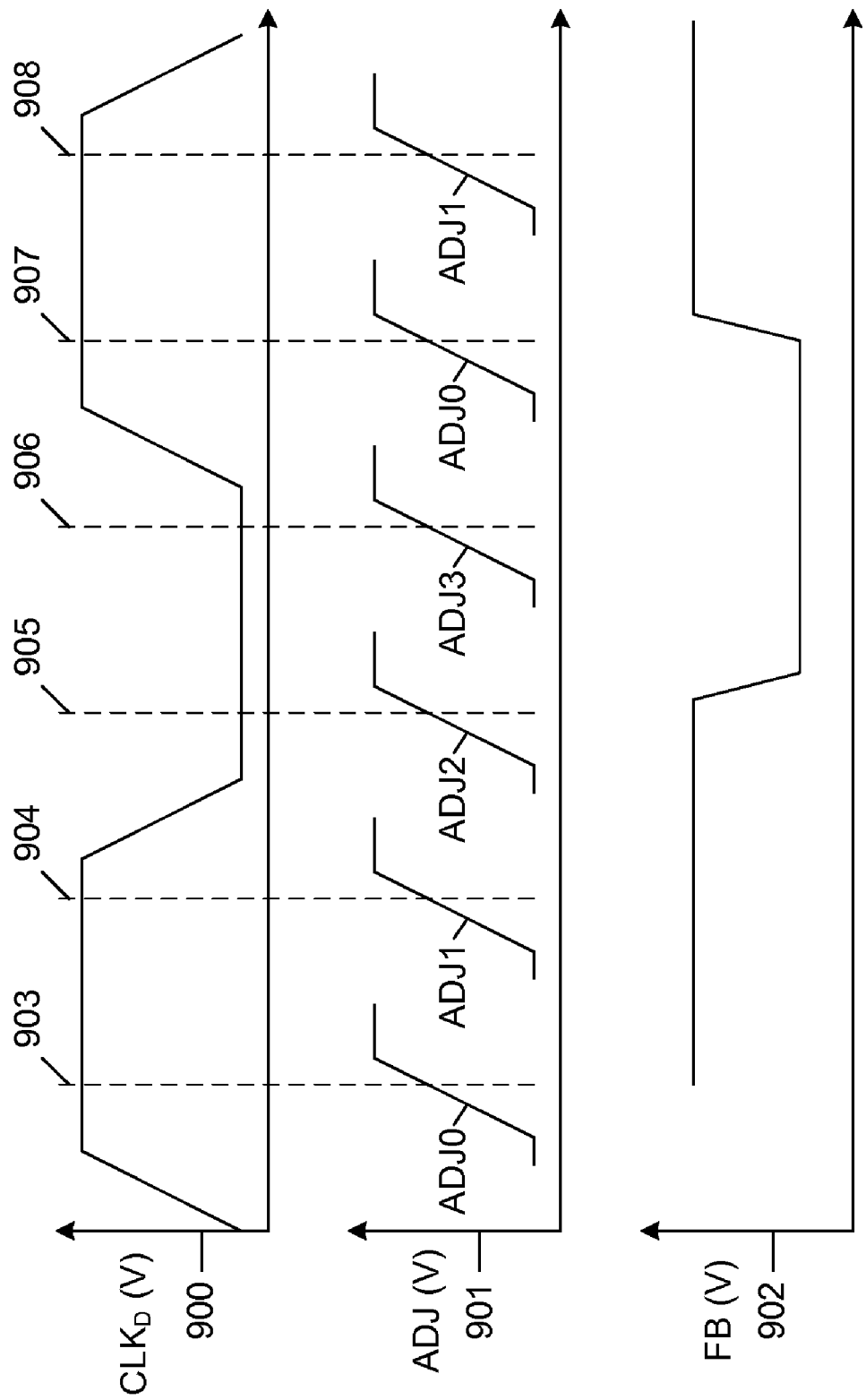

As mentioned previously, the present invention is superior to prior art methods in reducing the time it takes to achieve a lock condition. Relevant waveforms for a specific embodiment of the invention as shown in FIGS. 9A and 9B illustrate the speed advantage of the present invention. In FIG. 9A, axis 900 displays the periodic delayed clock signal $CLK_D$, which is a simple two-phase clock. The delayed clock signal $CLK_D$ starts out low at the start of its period. Control circuit 803 causes variable delay element 802 to sequentially generate Four phase shifted versions ADJ0, ADJ1, ADJ2 and ADJ3 of the adjustable signal ADJ, which are separated equally (by 90°), are shown on axis 901. The phase shifted versions ADJ0, ADJ1, ADJ2 and ADJ3 of the adjustable signal ADJ are phase shifted by 0, 90, 180, and 270 degrees. Only the rising edges of the phase shifted versions ADJ0-ADJ3 of the adjustable signal ADJ are shown in FIG. 9 for purposes of clarity. Also, even though rising edges of the phase shifted versions ADJ0, ADJ1, ADJ2 and ADJ3 of the adjustable signal ADJ are illustrated as occurring during a single cycle of the delayed clock signal $CLK_D$ for purposes of illustration, it is understood that only one of the phase shifted versions ADJ0-ADJ3 has a rising edge during any particular cycle of the delayed clock signal $CLK_D$.

The first step of sampling the delayed clock signal $CLK_D$ on axis 900 is performed using the rising edges of the phase shifted versions ADJ0, ADJ1, ADJ2 and ADJ3 on axis 901 at points marked by reference lines 903-906. (See, step 701 of FIG. 7.) The sampled state values of the delayed clock signal $CLK_D$ have logic states of 1, 1, 0, 0 at the points marked by reference lines 903-906, respectively. These logic states are reported to the control circuit 803 by the feedback signal FB provided by sampling flop 821.

As described above in connection with FIG. 7, the control circuit 803 evaluates the signature of the sampled state values, and determines that the rising edge of the phase shifted version ADJ3 leads the rising edge of the delayed clock signal $CLK_D$ by the smallest phase difference. (See, step 702 of FIG. 7.) Control circuit 803 makes this determination by identifying a '0' to '1' transition in the sampled state values, and then selecting the phase shifted version of the adjustable signal that is associated with the '0' value of the '0' to '1' transition. In the described example, the '0' to '1' transition in the sampled state values occurs between the rising edge of the phase shifted signal ADJ3 and the rising edge of the phase shifted signal ADJ0. Note that the cyclic nature of the phase shifted signals ADJ0-ADJ3 is illustrated by the rising edges of the phase shifted signals ADJ0 and ADJ1 at points 907 and 908, respectively. The time required to develop the signature of the delayed clock signal $CLK_D$ is equal to 4NT, wherein T is the period of the delayed clock signal $CLK_D$, and a rising edge of the adjustable signal is generated once every N cycles of the delayed clock signal $CLK_D$.

The control circuit 803 then sets the adjustable signal ADJ to be equal to the phase shifted version ADJ3 identified in response to the signature of the sampled state values. (See, step 703 of FIG. 7.) The control circuit 803 then implements a second sampling sweep, which is illustrated by FIG. 9B. During this second sampling sweep, the delayed clock signal $CLK_D$ is initially sampled at point 910 in response to the rising edge of the phase shifted version ADJ3 of the adjustable signal. The resulting logic '0' sample is returned to the control circuit 803 as the feedback signal FB. In response, the control circuit 803 adds an incremental delay d1 to the phase shifted version ADJ3 of the adjustable signal ADJ.

The next rising edge of the adjusted signal ADJ samples the delayed clock signal $CLK_D$ at point 911 (N cycles later), again providing a logic '0' sample value. In response, the control circuit 803 adds another incremental delay d2 to the phase shifted version ADJ3 of the adjustable signal ADJ.

The next rising edge of the adjusted signal ADJ samples the delayed clock signal $CLK_D$ at point 912 (N cycles later), again providing a logic '0' sample value. In response, the control circuit 803 adds another incremental delay d3 to the adjustable signal ADJ. The next rising edge of the adjusted signal ADJ samples the delayed clock signal $CLK_D$ at point 913 (N cycles later), this time providing a logic '1' sample value. At this time, the control circuit 803 stops the process, as the adjustable signal ADJ is now aligned with the delayed clock signal $CLK_D$. (See, step 704.) Note that the control circuit 803 continues to add incremental delays to the phase shifted version ADJ3 of the adjustable signal until the resulting sample value transitions from a logic '0' state to a logic '1' state.

The incremental delays d1-d3 are much shorter than the delays that exist between the phase shifted versions ADJ0-ADJ3 of the adjustable signal. For example, each of the incremental delays d1-d3 may represent a phase difference of about 3.6 degrees, or about 15 ps when sampling a delayed clock signal $CLK_D$ having a period of 1.5 ns. In accordance with one embodiment, it is not necessary for each of the incremental delays d1-d3 to be exactly equal to one another (i.e., the incremental delays can be non-monotonic). Thus, the incremental delays d1-d3 may advantageously be generated by an open loop delay line, wherein each incremental delay is added by routing the adjustable signal ADJ through a predetermined number of delay buffers. The incremental delays can alternately be introduced by a delay locked looped, a phase locked loop, or a buffer chain with multiple taps.

Because the initial sweep (steps 701-703 reduces the sweep range to ¼ of the period of the delayed clock signal $CLK_D$, the duration of the second sweep will be, at most:

$$\tfrac{1}{4}NT^2/t_{step}$$

wherein $t_{step}$ is equal to the incremental delay (e.g., d1).

The total worst case time to lock in seconds for this specific embodiment is therefore:

$$4NT+\tfrac{1}{4}NT^2/t_{step}$$

For the same benchmark DDR3-1333 memory system discussed above with reference to the prior art, this invention would achieve lock in 0.26 microseconds which is a greater than ten-fold improvement. Note that if the number of phase shifted versions of the adjustable signal ADJ is treated as a variable instead of being set to four, the number of phase shifted versions that would provided the fastest lock time could be solved for in terms of the period T, and the step size $t_{step}$. The number of phase shifted versions for minimum locking time would be equal to the square root of the quantity produced by dividing the clock's period T by the delay element's step size $t_{step}$. Improvements in locking time are important because increasing the speed of any calibration or start-up period in electronic systems decreases wasted power consumption.

In addition, CAD simulations of circuits during verification are extremely time consuming and often focus on start up conditions. Therefore, decreasing the calibration time can result in considerable time savings during verification of the circuit. Finally, some circuits may require multiple calibrations because of voltage and temperature drift. In such circuits, decreases in lock times can have a significant effect on the bandwidth of the system. These increases in speed are due in part to the fact that the time consuming second adjusting step is limited to a pre-screened range, but benefits also accrue because the current invention is resistant to false locks, and does not require multiple sampling at a given delay point.

Among the reasons that this invention is resistant to false locks is that the possibility of a falling edge being read as a rising edge is eliminated, and because detecting a false zero on a rising clock edge does not result in an inaccurate lock. False lock errors in the prior art arise because of a false reading within a tight vicinity of the falling edge of the target signal.

The present invention is able to avoid such a situation by using phase shifted versions in the initial sweep that are sufficiently separated. A false low still may be detected using the present invention because any blind sample of a signal could potentially land directly on the transition point of the target signal. However, a second consecutive false read will only happen if the next sample is also taken during the transition, is taken within the range of clock jitter, or is taken within the non-monotonic delay of any non-monotonic delay elements. As the distance between samples increases, the risk of the sample occurring within any of these distances decreases. Therefore, since the present invention samples during a first step where the sample distances are much larger than these amounts, embodiments of this invention are resistant to this type of false lock.

Figure 10:
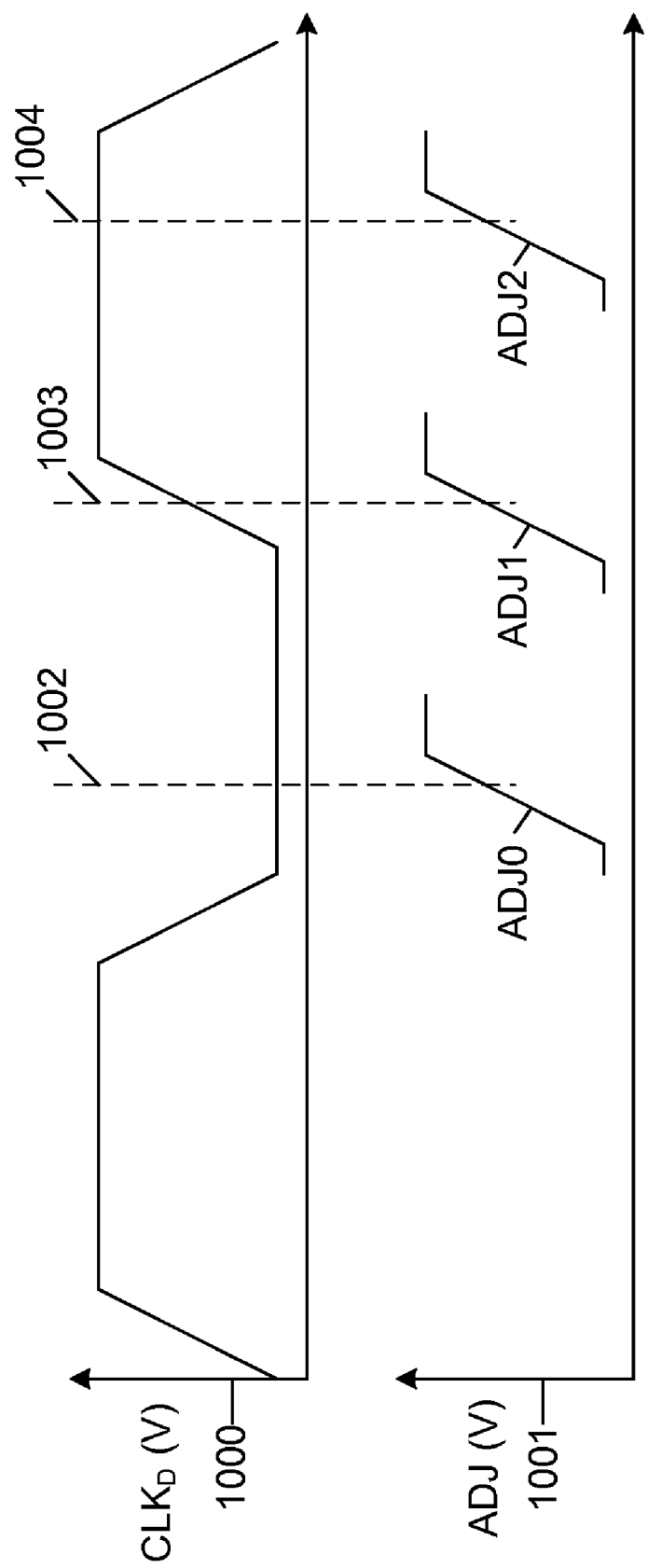
FIG. 10 is a waveform diagram illustrating the manner in which the method of FIG. 7 is resistant to false lock conditions, in accordance with one embodiment of the present invention.

The present invention is also resistant to false lock for reasons that can be described with reference to FIG. 10. In FIG. 10, axis 1000 displays a target signal ($CLK_D$) and axis 1001 displays three phase shifted versions ADJ0-ADJ2 of the adjustable signal used to sample the target signal. The phase shifted versions on axis 1001 sample the target signal at points identified by reference lines 1002, 1003, and 1004.

As mentioned before, without having any information about the target signal, it is not possible to begin sampling it in a way that completely avoids the possibility of sampling during a transition where the sampled value is uncertain. This exact situation is shown in FIG. 10, where sampling at the point marked by reference line 1003 could produce either a low or high value in an unpredictable manner. However, owing to the nature of certain embodiments of this invention, either value will not cause the lock to fail. In one situation, sampling at reference line 1003 would produce a high value. In that case, the linear sweep in the second step would begin at reference line 1002 and would continue until a high value was detected. In the other situation, sampling at reference line 1003 would produce a low value. In that case, the linear sweep in the second step would begin at reference line 1003 and the system would lock almost immediately.

In this embodiment, three phase shifted versions are used to sample the target signal in order to gain the benefit of error resistance and to guarantee a reduced lock time regardless of potential errors. Detecting the presence of a low to high transition takes a minimum of two samples. Since there is always the potential for a single erroneous value at a point such as 1003, two samples have the potential to provide no information because both of the samples could end up being the same value. Without the requisite minimum three phase shifted versions, the signature of the target signal would not contain enough information to select the desired version and guarantee a faster lock time as compared to the prior art.

Figure 11:
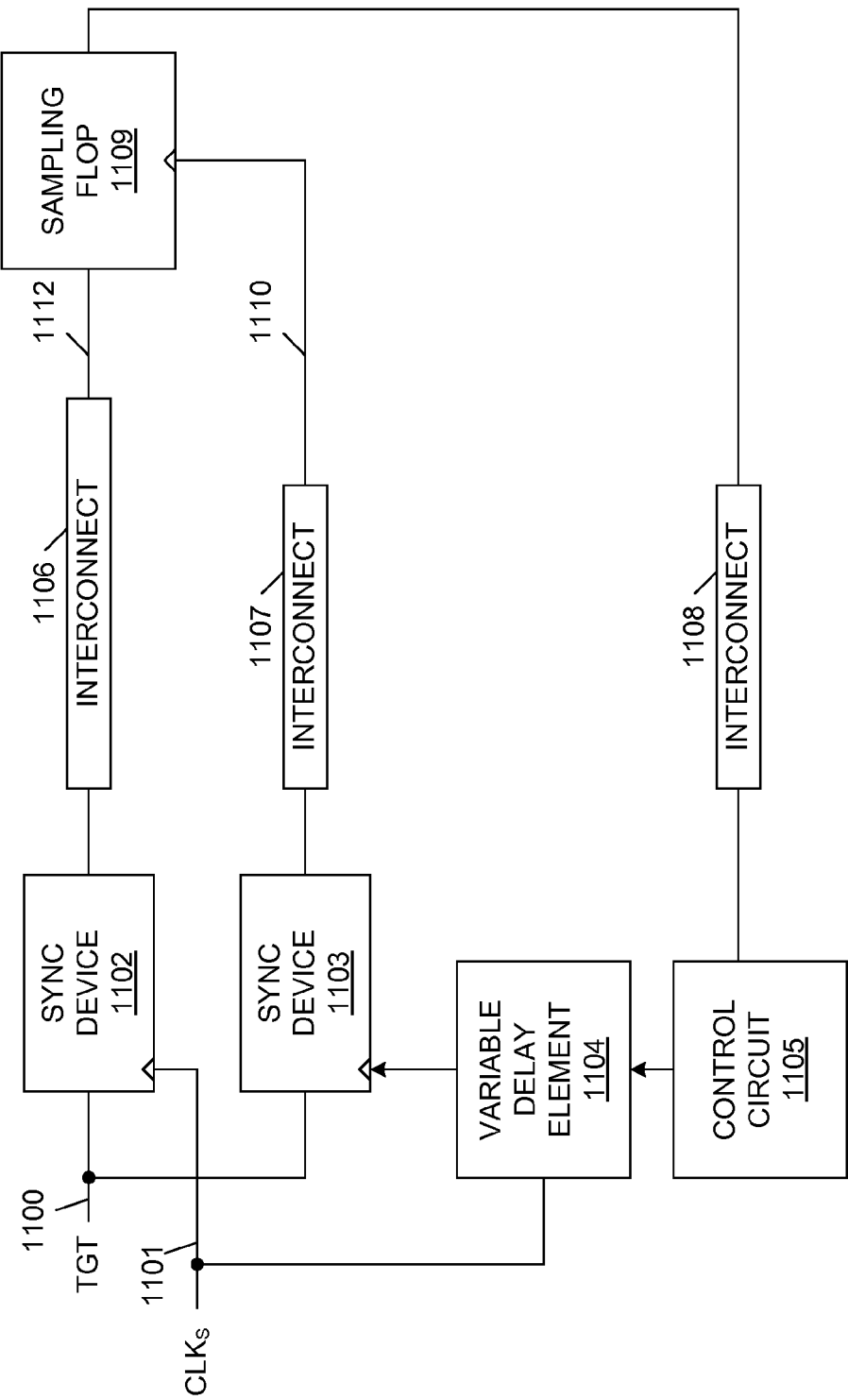
FIG. 11 is a block diagram of an alternate system that implements the alignment method of FIG. 7 in accordance with one embodiment of the present invention.

A signal alignment system in accordance with the present invention is displayed in FIG. 11. The purpose of the system is to reduce the phase difference between the signals on signal lines 1112 and 1110. The target signal TGT is provided to the circuit at node 1100, and is routed to data input terminals of synchronization devices 1102 and 1103. The synchronizing clock signal $CLK_S$ is provided to the system at node 1101, and is routed to the clock input of synchronization device 1102 and the input of variable delay element 1104. Synchronization device 1103 is clocked by variable delay element 1104. Interconnect 1106 connects synchronization device 1102 and sampling device 1109. Interconnect 1107 connects synchronization device 1103 and sampling device 1109. The two interconnects have different lengths to indicate the fact that it takes longer for a signal to propagate along interconnect 1106 as opposed to along interconnect 1107. Control circuit 1105 receives the output of sampling device 1109 after it propagates across interconnect 1108. Control circuit 1105 is capable of storing logic values from the output of sampling device 1109 and is also capable of adjusting the phase delay that variable delay element 1104 applies to the synchronizing clock $CLK_S$.

During calibration, control circuit 1105 controls the delay introduced by the variable delay element 1104, such that two sweeps are performed in a manner similar to that described above in connection with FIGS. 9A-9B. The control circuit 1105 introduces a first set of delays to the variable delay element 1104, such that the synchronization device 1103 transmits a first set of at least three output signals, at least two of which are phase shifted with respect to the output signals provided by synchronization device 1102. In one embodiment, control circuit 1105 initially controls variable delay element 1104 to introduce no delay, such that synchronization devices 1102 and 1103 simultaneously latch the target signal TGT. In this instance, there is zero phase difference between the signals transmitted from the synchronous devices 1102-1103 to interconnects 1106-1107.

After receiving the resulting sample value from sampling flop 1109, control circuit 1105 increments the delay introduced by variable delay element 1104, wherein the delay introduced represents ¼ cycle (i.e., a 90° phase difference) of the target signal. Sampling flop 1109 provides the resulting sample value to control circuit 1105. Control circuit 1105 repeats the above described process two more times, each time introducing an additional ¼ cycle delay to the target signal on node 1110. (As described above, each successive sample is separated by N cycles). As a result, the control circuit 1105 receives four sample values that are phase shifted 90 degrees with respect to one another. Although the present example describes four sample values, it is understood that three or more sample values may be taken during the first sweep in the manner described above.

Control circuit 1105 evaluates the sample values taken during the first sweep to determine which one of the sample values results in a signal on line 1110 that leads the signal on line 1112 by the smallest phase difference. (See, e.g., step 702 of FIG. 7.) That is, control circuit 1105 determines which one of the sample values has a logic '0' state, and is followed by a sample value having a logic '1' state. To start the second sweep, control circuit 1105 controls variable delay element 1104, such that variable delay element 1104 introduces the delay that resulted in the signal on line 1110 leading the signal on line 1112 by the smallest phase difference. (See, e.g., step 703 of FIG. 7). Then, control circuit 1105 will increment the delay applied by variable delay element 1104 by smaller, incremental values, until the feedback signal received from sampling flop 1109 through interconnect 1108 has a logic '1' state. (See, e.g., step 704 of FIG. 7.) At this time, the delay introduced by variable delay element 1104 is selected to be the calibrated delay value.

In accordance with one embodiment, a system similar to the one described with reference to FIG. 11 is used to align the system clock signal and the data strobe DQS signals in a DDR3 memory system. The signal on line 1112 would be the system clock arriving at memory cell and the signal on line 1110 would be the data strobe DQS signal arriving at the memory cell. Data lines 1110 and 1112 would therefore be the operative locations of the signals because the signals are used to trigger the system to act at the memory cell locations. Interconnects 1106, 1107 and 1108 in FIG. 11 would be connecting a memory cell and a memory system controller. The memory system controller is represented in FIG. 11 by devices 1102, 1103, 1104 and 1105. The configuration displayed in FIG. 11 would be the system in a configuration mode. During regular operation the output of sampling device 1109 would be the signal line of a memory cell.

The error-resistance of embodiments of the present invention lead to several related benefits. As mentioned previously, the prior art methods often employ multiple sampling at the same delay value point to assure that there has not been a false value detection. Likewise, precision delay elements are often needed to avoid non-monotonic delay errors caused by process variation, supply voltage variation, temperature variation, and asymmetric design approaches. However, the present invention does not require the use of precision delay elements such as phase interpolators and the design can therefore be less costly in terms of die size and design complexity.

The error resistant nature of embodiments of the present invention are of particular utility when the invention is applied to the task of write leveling in a memory system. Most memory control elements contain a delay locked loop (DLL) used to produce a quadrature shifted version of the system clock. Advantageously, this DLL can serve as the delay element necessary to create the phase shifted versions of the adjustable signal. This approach would therefore save a considerable amount of space because no additional delay element would be needed to create the phase shifted versions of the adjustable signal.

Finally, the fact that the delay element does not have to be extremely precise as compared to the clock speed will result in a calibration circuit that is completely scalable. Usually a transition from DDR3-1333 to a higher clock speed system such as DDR3-2400 requires a redesign of the calibration circuit because the higher clock speed would require a more accurate delay element. However, since the present invention is error resistant and does not require highly accurate delay elements, the same state machine and write leveling engine would scale to different memory systems with very little design effort.

An additional benefit of the present invention is that it could be adapted to use prior art circuits with very few modifications. The major modification required would be to allow the control circuit to store values during the initial sampling phases when the signature of the target signal is being obtained. Since this circuitry could be implemented solely through the use of digital logic, the modification would add a minimal amount to the overall cost of the system.

In another embodiment of the invention, the first phase of sampling the target signal would terminate as soon as two target signal state values were detected that indicate that their respective phase shifted versions sampled that target signal before and after its reinitializing point. In the specific embodiment discussed above with reference to FIGS. 9A and 9B, the first step of sampling the target signal would be halted as soon as a consecutive set of target state values were low and high. If, for example, those two target signals were the first to be obtained, the algorithm would immediately select the first phase shifted version in the pair to be the basis for the next phase of the alignment process. This variation could lead to even faster locking with only minimal additional complexity in the control circuit.

In another embodiment of the invention, the second sweep of the alignment process would be a variation on JEDEC's constant incremental sweep. Instead of stepping the adjustable signal one step at a time in equal amounts, the sweep could begin with a large step size that would be used until a lock was detected. At that point, the algorithm would subtract delay from the delay element in an amount equal to the last step taken. Then the sweep would begin again using a smaller step size. The relative sizes of the first and second step sizes would trade-off lock speed and accuracy as required by a given application.

Although the invention has been discussed primarily with respect to specific embodiments thereof, various other modifications are possible. For example, the number of phase shifted versions could be any number greater than two, and the phase shifted versions need not be evenly spaced, especially if information regarding the target signal was known before the first sampling took place. The invention is also not limited to the target signal being a simple two phase clock. Instead, the present invention can be applied to function with any periodic target signal regardless of complexity. In addition, any form of sweep and detect algorithm could be applied after the initial phase of the sampling process, and any number of alternating steps of signature detection and sweep-till-detect algorithms could be employed.

Various configurations of input and output circuits may be used in place of, or in addition to, the circuit configurations presented herein. Nothing in this specification should be read to limit the invention to an embodiment where the entire system is implemented on a single SOC or circuit board, an embodiment requiring wired connections, or an embodiment where the signals are propagated through the use of charged particles.

The invention will function with any system that routes signals from a transmission point to a recipient subsystem. The invention is not limited to use with silicon and can be applied to any semiconductor material including compound semiconductors. Functions may be performed by hardware or software, as desired. In general, any circuit diagrams presented are only intended to indicate one possible configuration, and many variations are possible. Those skilled in the art will also appreciate that methods and systems consistent with the present invention are suitable for use in a wide range of applications involving the alignment of periodic signals.

While the specification has been described in detail with respect to specific embodiments of the invention, it will be appreciated that those skilled in the art may readily conceive of various modifications, without departing from the spirit and scope of the present invention. For example, although the invention has been described in connection with identifying the phase shifted version of the adjustable signal that leads the target signal by the smallest phase difference, and then adding incremental delays to align the adjustable signal to the target signal, it is understood that other embodiments could identify the phase shifted version of the adjustable signal that lags the target signal by the smallest phase difference, and then subtract incremental delays to align the adjustable signal to the target signal. Accordingly, the present invention is limited only by the following claims.

I claim:

1. A method for reducing a phase difference between a target signal and an adjustable signal, comprising the steps of:
sampling said target signal using a group of three or more phase shifted versions of said adjustable signal to obtain a group of three or more corresponding target signal state values; then
evaluating the group of three or more target signal state values to determine which one of the three or more phase shifted versions of said adjustable signal leads the target signal by a smallest phase difference, wherein this one of the three or more phase shifted versions of said adjustable signal is identified as a selected phase shifted version of said adjustable signal; and then
sampling said target signal using the selected phase shifted version of said adjustable signal and incrementally delayed versions of the selected phase shifted version of said adjustable signal until said adjustable signal is aligned with the target signal.

2. The method of claim 1, wherein the steps of sampling are performed by a sampling device having an aperture window in which sampling errors occur, wherein each of the group of three or more phase shifted versions of said adjustable signal are separated by a phase greater than the aperture window of the sampling device.

3. The method of claim 1, wherein the three or more phase shifted versions of said adjustable signal are separated by a first phase difference, and the incrementally delayed versions of the selected phase shifted version of said adjustable signal are separated by a second phase difference, wherein the first phase difference is greater than the second phase difference.

4. The method of claim 3, wherein the first phase difference is at least 16 times greater than the second phase difference.

5. The method of claim 1, wherein the three or more phase shifted versions of said adjustable signal include four phase shifted versions of said adjustable signal, which are separated by phases of 90 degrees.

6. The method of claim 1, further comprising generating the incrementally delayed versions of the selected phase shifted version of said adjustable signal with an open-loop delay line.

7. The method of claim 1, wherein unequal delays exist between the incrementally delayed versions of the selected phase shifted version of said adjustable signal.

8. The method of claim 1, wherein said target signal is a periodic clock signal, and said sampling is performed at an operative signal location.

9. The method of claim 1, wherein a phase difference between any consecutive pair of said phase shifted versions is uniform.

10. A method for reducing a phase difference between a target signal and an adjustable signal, comprising the steps of:
sampling said target signal using a group of three or more phase shifted versions of said adjustable signal to obtain a group of target signal state values;
evaluating the group of target signal state values to determine which one of the three or more phase shifted versions of said adjustable signal leads the target signal by a smallest phase difference, wherein this one of the three or more phase shifted versions of said adjustable signal is identified as a selected phase shifted version of said adjustable signal; and then
sampling said target signal using the selected phase shifted version of said adjustable signal and incrementally delayed versions of the selected phase shifted version of said adjustable signal until said adjustable signal is aligned with the target signal, wherein the steps of sampling are performed by a sampling device having an aperture window in which sampling errors occur, wherein each of the group of three or more phase shifted versions of said adjustable signal are separated by a phase greater than the aperture window of the sampling device, and wherein the target signal exhibits a maximum jitter duration, wherein each of the group of three or more phase shifted versions of said adjustable signal are separated by a phase greater than the maximum jitter duration of the target signal.

11. A method for reducing a phase difference between a target signal and an adjustable signal, comprising the steps of:
sampling said target signal using a group of three or more phase shifted versions of said adjustable signal to obtain a group of target signal state values;
evaluating the group of target signal state values to determine which one of the three or more phase shifted versions of said adjustable signal leads the target signal by a smallest phase difference, wherein this one of the three or more phase shifted versions of said adjustable signal is identified as a selected phase shifted version of said adjustable signal; and then
sampling said target signal using the selected phase shifted version of said adjustable signal and incrementally delayed versions of the selected phase shifted version of said adjustable signal until said adjustable signal is aligned with the target signal, wherein the steps of sampling are performed by a sampling device having an aperture window in which sampling errors occur, wherein each of the group of three or more phase shifted versions of said adjustable signal are separated by a phase greater than the aperture window of the sampling device, and wherein the adjustable signal exhibits a maximum delay error duration, wherein each of the group of three or more phase shifted versions of said adjustable signal are separated by a phase greater than the maximum delay error duration of the adjustable signal.

12. A method for reducing a phase difference between a target signal and an adjustable signal, comprising the steps of:
sampling said target signal using a group of three or more phase shifted versions of said adjustable signal to obtain a group of target signal state values;
evaluating the group of target signal state values to determine which one of the three or more phase shifted versions of said adjustable signal leads the target signal by a smallest phase difference, wherein this one of the three or more phase shifted versions of said adjustable signal is identified as a selected phase shifted version of said adjustable signal; and then
sampling said target signal using the selected phase shifted version of said adjustable signal and incrementally delayed versions of the selected phase shifted version of said adjustable signal until said adjustable signal is aligned with the target signal;
wherein the step of evaluating the group of target signal state values comprises:
identifying a first target signal state value having a first logic state;
identifying a second target signal state value having a second logic state, different than the first logic state, wherein the first target signals state value and the second target signal state value are consecutive target signal state values; and
identifying a phase shifted version of the adjustable signal used to sample the first target signal state value as the selected phase shifted version of said adjustable signal.

13. A signal alignment system comprising:
a sampling device located at an operative location where a target signal is to be aligned with an adjustable signal, wherein the sampling device samples the target signal in response to the adjustable signal; and
a control circuit that controls the adjustable signal to undergo a first sweep and a subsequent second sweep and is coupled to receive and store sample values from the sampling device, wherein the control circuit generates three or more phase shifted versions of the adjustable signal during the first sweep, and then evaluates sample values associated with the three or more phase shifted versions of the adjustable signal to identify which one of the three or more phase shifted versions of said adjustable signal leads the target signal by a smallest phase difference, and then generates incrementally delayed versions of the identified one of the three or more phase shifted versions of said adjustable signal during the second sweep, until said adjustable signal is aligned with the target signal.

14. The signal alignment system of claim 13, further comprising:
a first interconnect that routes the target signal to the sampling device;
a second interconnect that routes the adjustable signal to the sampling device, wherein the first interconnect exhibits a longer delay than the second interconnect.

15. The signal alignment system of claim 13, wherein the control circuit is configured to generate the three or more phase shifted versions of the adjustable signal such that consecutive phase shifted versions of the adjustable signal are separated by phase delays that are greater than an aperture window of the sampling device.

16. The signal alignment system of claim 13, wherein the control circuit is configured to generate the three or more phase shifted version of the adjustable signal such that consecutive phase shifted versions of the adjustable signal are separated by phase delays that are greater than the maximum expected delay error of the target signal or the adjustable signal.

17. The signal alignment system of claim 13, further comprising:
a first synchronizing device that samples a first signal in response to a synchronizing clock signal, whereby the first synchronizing device provides the target signal to the sampling device;
a variable delay element coupled to the control circuit, and further coupled to receive the synchronizing clock signal, wherein the control circuit controls the variable delay element to introduce delays to the synchronizing clock signal, thereby creating an adjusted synchronizing clock signal; and
a second synchronizing device that samples the first signal in response to the adjusted synchronizing clock signal, whereby the second synchronizing device provides the adjustable signal to the sampling device.

18. A method for reducing a phase difference between a data strobe signal and a clock signal in a memory system, comprising the steps of:
sampling said clock signal at a memory cell boundary using a group of three or more phase shifted versions of said data strobe signal to obtain a group of three or more associated clock state values, said group of three or more phase shifted versions including a first phase shifted version and a second phase shifted version, said first shifted phase version and said second phase shifted version being consecutive; then
evaluating the obtained group of three or more associated clock state values to determine that the first phase shifted version obtained an associated clock state value having a low value, and the second phase shifted version obtained an associated second clock state value having a high value, and in response to this determination, setting a phase of said data strobe signal to be equal to a phase of said first phase shifted version; and then
adjusting a phase of said data strobe signal until said phase difference between said clock signal and said data strobe signal is minimized.

19. The method for reducing a phase difference between a data strobe signal and a clock signal in a memory system of claim 18, wherein said three or more phase shifted versions of said data strobe signal are selected such that consecutive phase shifted versions of said data strobe signal are separated by phase delays that are large enough to prevent more than a single error during consecutive samplings.

20. The method for reducing a phase difference between a data strobe signal and a clock signal in a memory system of claim 18, wherein said group of three or more phase shifted versions of said data strobe signal comprises four equally spaced versions at 0, 90, 180, and 270 degrees.

21. The method for reducing a phase difference between a data strobe signal and a clock signal in a memory system of claim 18, wherein said memory system is a double data rate 3 (DDR3) system.

* * * * *